United States Patent
Huang et al.

(10) Patent No.: US 10,170,511 B1
(45) Date of Patent: Jan. 1, 2019

(54) SOLID-STATE IMAGING DEVICES HAVING A MICROLENS LAYER WITH DUMMY STRUCTURES

(71) Applicant: VisEra Technologies Company Limited, Hsin-Chu (TW)

(72) Inventors: Tzu-Wei Huang, Zhubei (TW); Chi-Han Lin, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/616,390

(22) Filed: Jun. 7, 2017

(51) Int. Cl.
  *H04N 5/335* (2011.01)
  *H01L 27/146* (2006.01)

(52) U.S. Cl.
  CPC .... *H01L 27/14627* (2013.01); *H01L 27/1462* (2013.01); *H01L 27/14621* (2013.01); *H01L 27/14623* (2013.01); *H01L 27/14636* (2013.01); *H01L 27/14685* (2013.01)

(58) Field of Classification Search
  None
  See application file for complete search history.

(56) References Cited

U.S. PATENT DOCUMENTS

| | | | |
|---|---|---|---|
| 2008/0074520 A1* | 3/2008 | Matsuda | H01L 27/14627 348/294 |
| 2009/0302406 A1 | 12/2009 | Gambino et al. | |
| 2012/0068294 A1* | 3/2012 | Lee | H01L 27/14623 257/435 |

FOREIGN PATENT DOCUMENTS

| | | |
|---|---|---|
| JP | 2007-150260 A | 6/2007 |
| JP | 2012-252259 A | 12/2012 |
| JP | 2016-103615 A | 6/2016 |
| JP | 2016-201524 A | 12/2016 |
| WO | WO-2014/148276 A1 | 9/2014 |

OTHER PUBLICATIONS

Japanese Notification of Reasons for Rejection; Patent Application No. 2017-157805; dated Oct. 1, 2018.

* cited by examiner

*Primary Examiner* — Long Pham
(74) *Attorney, Agent, or Firm* — Muncy, Geissler, Olds & Lowe, P.C.

(57) ABSTRACT

A solid-state imaging device has a sensing region, a pad region and a peripheral region between the sensing region and the pad region. The solid-state imaging device includes a plurality of photoelectric conversion elements formed in a semiconductor substrate and disposed in the sensing region, and a bond pad disposed on the semiconductor substrate and in the pad region. The solid-state imaging device further includes a microlens layer disposed above the semiconductor substrate. The microlens layer includes a microlens array in the sensing region and a first dummy structure in the pad region. The first dummy structure includes a plurality of first microlens elements disposed to surround an area of the bond pad. Moreover, the solid-state imaging device includes a passivation film conformally formed on a top surface of the microlens layer.

20 Claims, 7 Drawing Sheets

SOLID-STATE IMAGING DEVICES HAVING A MICROLENS LAYER WITH DUMMY STRUCTURES

BACKGROUND

Field of the Invention

The invention relates to imaging devices, and more particularly, to solid-state imaging devices having a microlens layer with dummy structures.

Description of the Related Art

Image sensors have been widely used in various image-capturing apparatuses, for example video cameras, digital cameras and the like. Generally, solid-state imaging devices such as charge-coupled device (CCD) sensors or complementary metal-oxide semiconductor (CMOS) sensors have photoelectric transducers like photodiodes for converting light into electric charges. The photodiodes are formed in a semiconductor substrate such as a silicon chip. Signal charges corresponding to photoelectrons generated in the photodiodes are obtained by a CCD-type or a CMOS-type reading circuit.

In solid-state imaging devices, the photodiodes are arranged in a pixel array. In addition, the solid-state imaging devices have a microlens array disposed over the photodiodes. Each microlens element of the microlens array is aligned with a corresponding photodiode in each pixel. A passivation film is usually formed on the microlens array to protect the microlens elements during subsequent processing steps, such as dicing individual chips from a wafer in a package process of the imaging devices.

BRIEF SUMMARY

Solid-state imaging devices are often fabricated by using multiple material layers that may be incompatible. In solid-state imaging devices, a passivation film is formed on a microlens array and a microlens underlying layer for protecting microlens elements. In general, the materials between the passivation film and the microlens underlying layer are different and incompatible. The mismatch between the passivation film and the microlens underlying layer may cause the passivation film to crack, delaminate, or otherwise fail, thereby reducing the reliability and functionality of the solid-state imaging devices.

According to embodiments of the disclosure, solid-state imaging devices have a microlens layer with dummy structures around an area of a bond pad. The embodiments of the solid-state imaging devices can prevent a passivation film on the microlens layer from cracking, delaminating, or experiencing similar failures. Thus, the reliability and functionality of the solid-state imaging devices are enhanced.

In some embodiments, a solid-state imaging device is provided. The solid-state imaging device has a sensing region, a pad region and a peripheral region located between the sensing region and the pad region. The solid-state imaging device includes a semiconductor substrate and a plurality of photoelectric conversion elements formed in the semiconductor substrate and disposed in the sensing region. The solid-state imaging device also includes a bond pad disposed on the semiconductor substrate and in the pad region. The solid-state imaging device further includes a microlens layer disposed above the semiconductor substrate. The microlens layer includes a microlens array and a first dummy structure. The microlens array is disposed in the sensing region and the first dummy structure is disposed in the pad region. The first dummy structure includes a plurality of first microlens elements disposed to surround an area of the bond pad. In addition, the solid-state imaging device includes a passivation film conformally formed on a top surface of the microlens layer.

In some embodiments, the microlens layer further includes a second dummy structure disposed in the peripheral region. The second dummy structure includes a plurality of second microlens elements, and the microlens array includes a plurality of third microlens elements.

In some embodiments, each of the third microlens elements of the microlens array has a third microlens height that is greater than the second microlens height of each of the second microlens elements of the second dummy structure. In addition, the second microlens height is greater than the first microlens height of each of the first microlens elements of the first dummy structure.

In some embodiments, each of the first microlens elements has a first radius of curvature, each of the second microlens elements has a second radius of curvature, and the first radius of curvature is greater than the second radius of curvature. In addition, each of the third microlens elements of the microlens array has a third radius of curvature, and the second radius of curvature is greater than the third radius of curvature.

A detailed description is given in the following embodiments with reference to the accompanying drawings.

BRIEF DESCRIPTION OF DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION OF INVENTION

The following description is the contemplated mode of carrying out some embodiments of the disclosure. This description is made for the purpose of illustrating the general principles of some embodiments of the invention and should not be taken in a limiting sense. The scope of the invention is best determined by reference to the appended claims.

Figure 1:
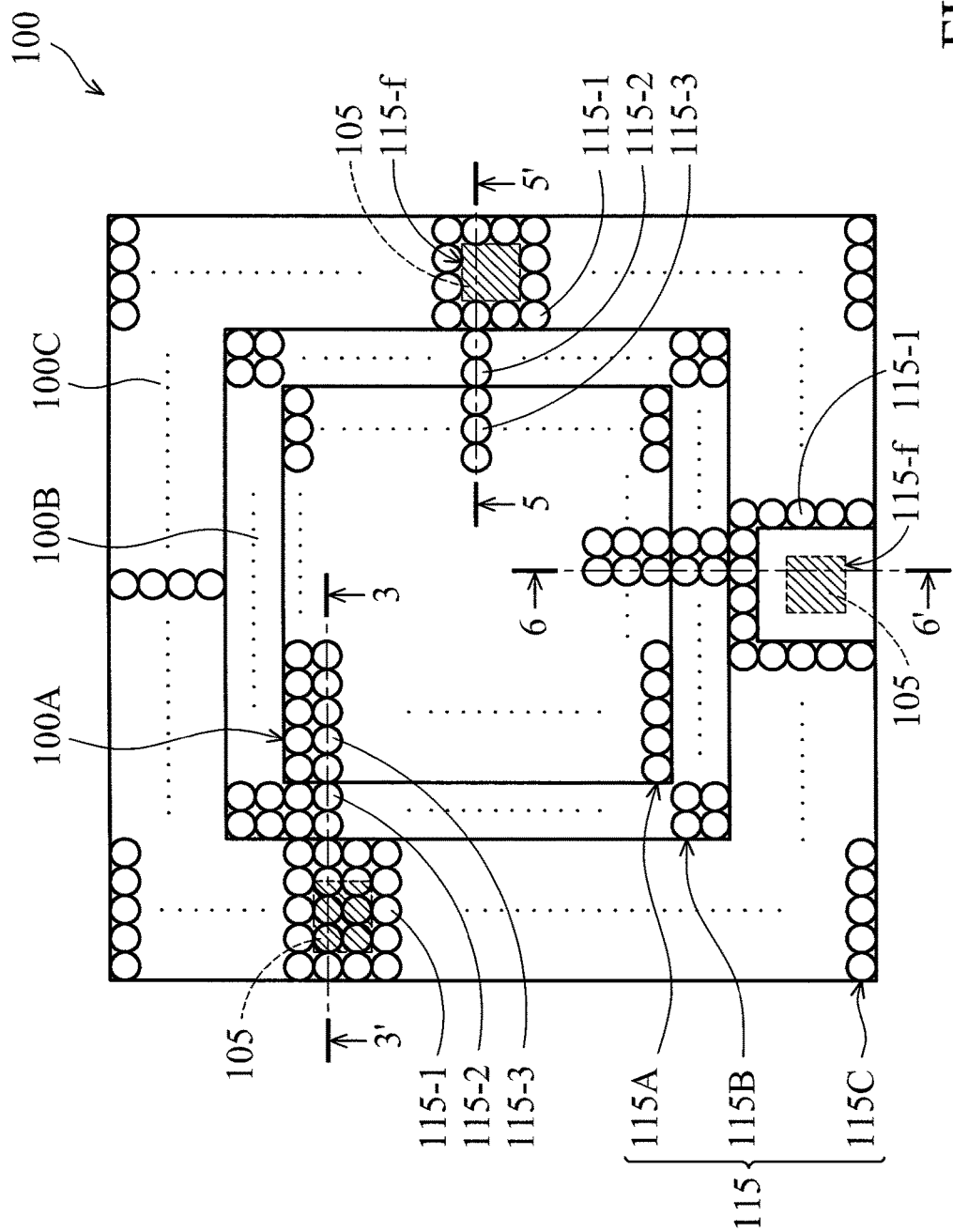
FIG. 1 shows a schematic plane view of a solid-state imaging device having a microlens layer with dummy structures around an area of a bond pad according to some embodiments.

Referring to FIG. 1, a schematic plane view of a solid-state imaging device 100 having a microlens layer 115 with dummy structures 115B and 115C according to some embodiments is shown. The solid-state imaging device 100 has a sensing region 100A, a pad region 100C and a peripheral region 100B located between the sensing region 100A and the pad region 100C. The peripheral region 100B surrounds the sensing region 100A, and the pad region 100C surrounds the peripheral region 100B. The solid-state imaging device 100 includes a plurality of photoelectric conversion elements (not shown in FIG. 1) formed in a semiconductor substrate (not shown in FIG. 1) and disposed in the sensing region 100A. The solid-state imaging device 100 also includes a plurality of bond pads 105 disposed on the semiconductor substrate and in the pad region 100C. The bond pad 105 is used to connect to an outer circuit component (not shown) and is also electrically coupled to the photoelectric conversion elements through an interconnection layer (not shown in FIG. 1).

According to embodiments of the invention, the microlens layer 115 includes a microlens array 115A, a first dummy structure 115C and a second dummy structure 115B. The first dummy structure 115C is disposed in the pad region 100C and includes a plurality of first microlens elements 115-1 that are disposed to surround an area of the bond pad 105. The second dummy structure 115B is disposed in the peripheral region 100B and includes a plurality of second microlens elements 115-2. The microlens array 115A is disposed in the sensing region 100A and includes a plurality of third microlens elements 115-3 that are arranged in an array. Each of the third microlens elements 115-3 is disposed in one pixel of the solid-state imaging device 100 and corresponds to one individual photoelectric conversion element to collect incident light on the respective photoelectric conversion element.

FIG. 1 shows various embodiments of the layout of the first dummy structure 115C in the pad region 100C including around the area of the bond pads 105 and directly above the bond pads 105. For example, the layouts of the first dummy structure 115C in the areas of the left bond pad 105, the right bond pad 105 and the lower bond pad 105 as shown in FIG. 1. In some embodiments, the layouts of the first dummy structure 115C in the areas of all bond pads 105 are the same in one solid-state imaging device.

In some embodiments, the first microlens elements 115-1 of the first dummy structure 115C are continuously and regularly arranged in the pad region 100C. The first microlens elements 115-1 are disposed to surround the area of the bond pad 105 and are further disposed directly above bond pad 105, as shown in the region of the left bond pad 105 of FIG. 1.

In some other embodiments, the first microlens elements 115-1 of the first dummy structure 115C are continuously and regularly arranged in the pad region 100C outside of the area of the bond pad 105. In addition, the first dummy structure 115 further includes a flat portion 115-f disposed directly above bond pad 105, as shown in the region of the right bond pad 105 of FIG. 1. The flat portion 115-f has a flat top surface without the convex topography of the first microlens elements 115-1.

In some other embodiments, the first microlens elements 115-1 of the first dummy structure 115C are continuously and regularly arranged in the pad region 100C outside of the area of the bond pad 105. Moreover, the first microlens elements 115-1 are not disposed along the edges of the area of the bond pad 105. The first dummy structure 115 also includes a flat portion 115-f disposed directly above the bond pad 105 and further extends to an area outside of the area of the bond pad 105 until the edge of the solid-state imaging device 100, as shown in the region of the lower bond pad 105 of FIG. 1. Also, the flat portion 115-f has a flat top surface without the convex topography of the first microlens elements 115-1.

In some embodiments, the second microlens elements 115-2 of the second dummy structure 115B are continuously and regularly arranged in the peripheral region 100B. In the embodiments, the third microlens elements 115-3 of the microlens array 115A, the second microlens elements 115-2 of the second dummy structure 115B, and the first microlens elements 115-1 of the first dummy structure 115C are all arranged by the same pitch. A pitch of the microlens elements is defined by the bottom width of the convex lens body of one microlens element and the distance between two adjacent microlens elements added together. If the two adjacent microlens elements are disposed closely without a space, the pitch of the microlens elements is equal to the bottom width of the convex lens body of one microlens element.

Figure 2:
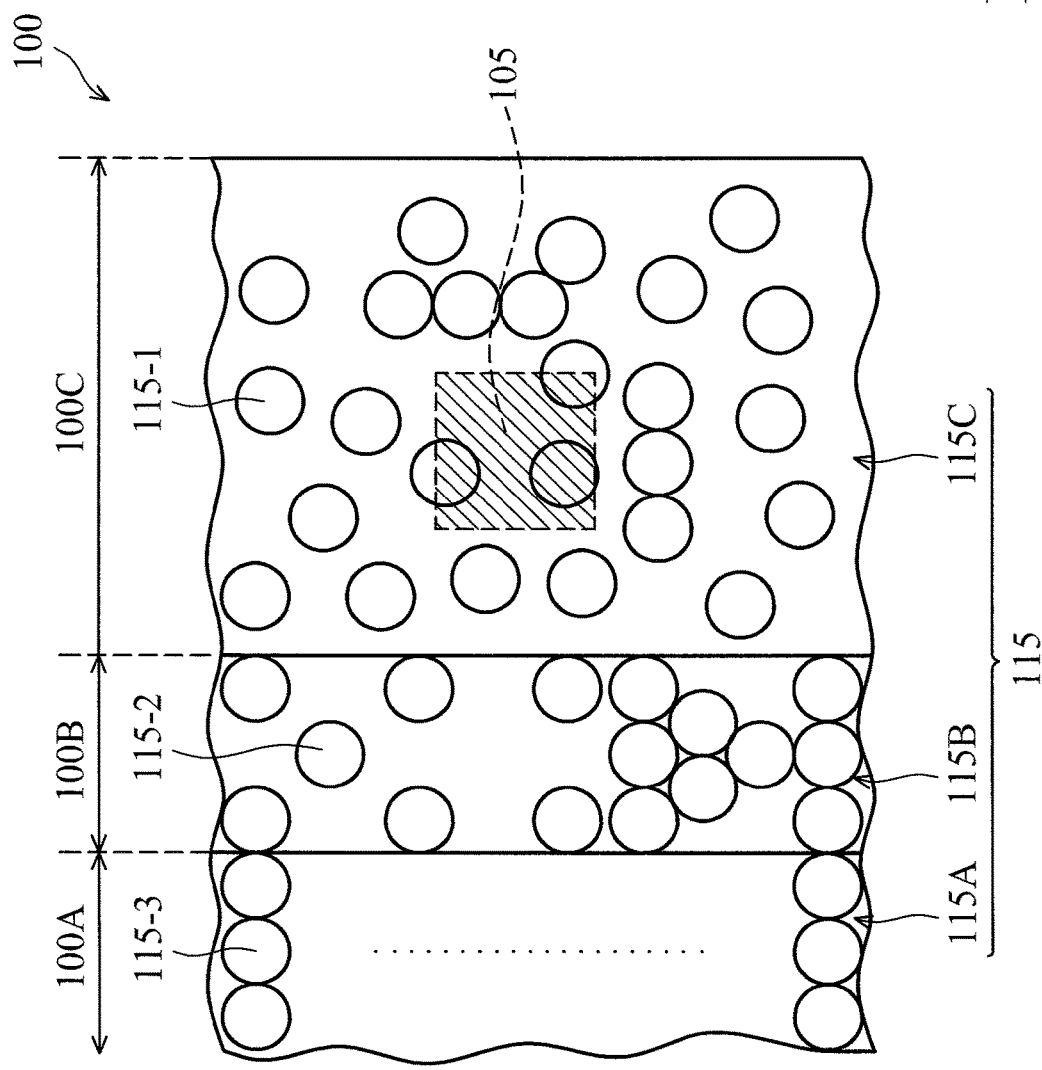
FIG. 2 shows a schematic partial plane view of a layout of various microlens elements of a microlens layer in a solid-state imaging device according to some embodiments.

Referring to FIG. 2, a schematic partial plane view of a layout of the first, second and third microlens elements 115-1, 115-2 and 115-3 of a microlens layer 115 in a solid-state imaging device 100 according to some other embodiments is shown. In the embodiments, the third microlens elements 115-3 of the microlens array 115A are arranged in an array, as per the above description. The second microlens elements 115-2 of the second dummy structure 115B are discontinuously and randomly arranged in the peripheral region 100B. Also, the first microlens elements 115-1 of the first dummy structure 115C are discontinuously and randomly arranged in the pad region 100C. Moreover, in the embodiments, the first microlens elements 115-1 of the first dummy structure 115C are still disposed to surround the area of the bond pad 105.

Figure 3:
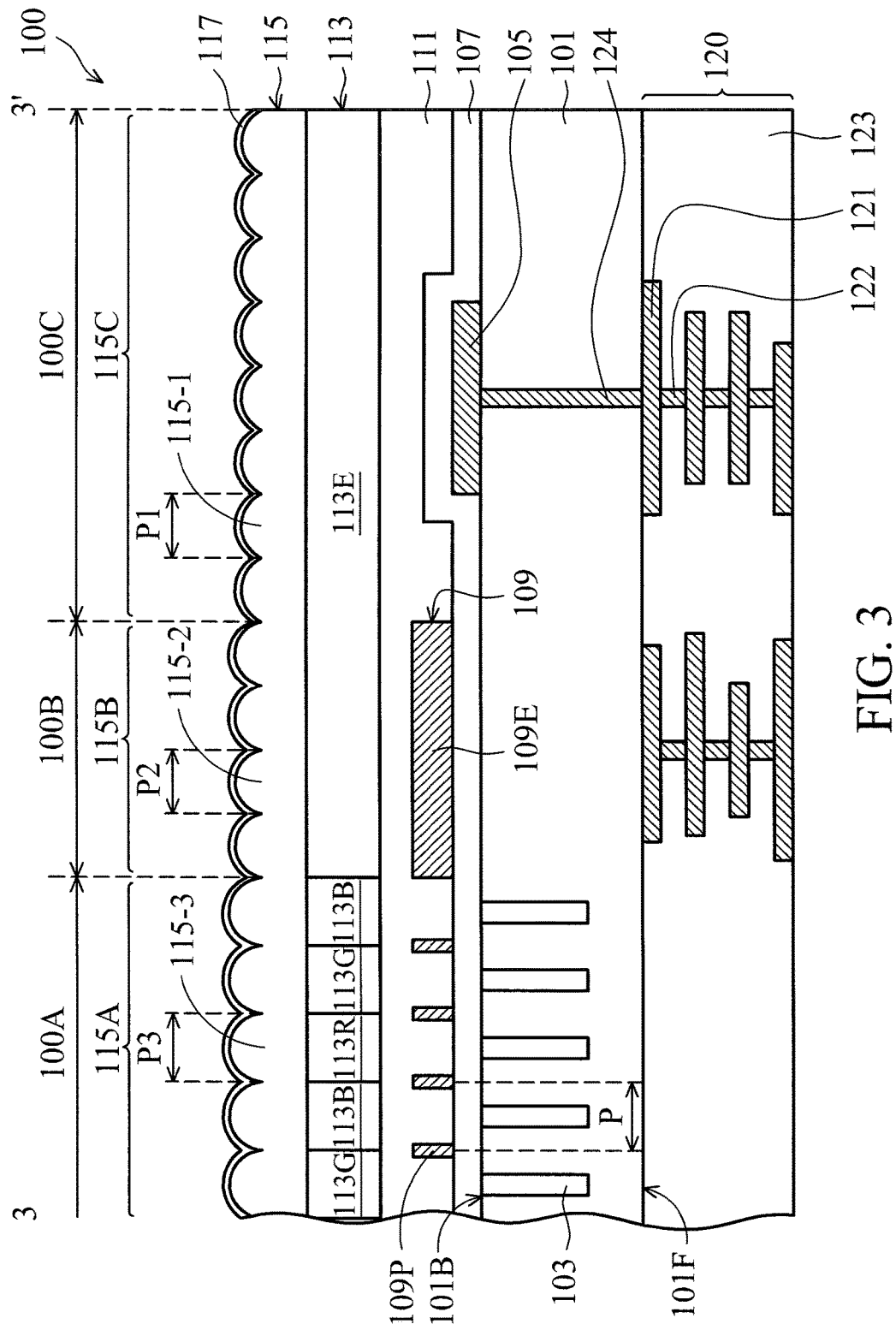
FIG. 3 shows a schematic partial cross section of a solid-state imaging device along line 3-3' of FIG. 1 according to some embodiments.

Referring to FIG. 3, a schematic partial cross section of a solid-state imaging device 100 along line 3-3' of FIG. 1 according to some embodiments is shown. The solid-state imaging device 100 includes a semiconductor substrate 101. The material of the semiconductor substrate 101 includes silicon, germanium, silicon-germanium alloy, or another compound semiconductor material such as gallium-arsenide or indium-arsenide. In some embodiments, the semiconductor substrate 101 may be a semiconductor-on-insulator (SOI) substrate. A plurality of photoelectric conversion elements 103, for example photodiodes, is formed in the semiconductor substrate 101 and disposed near a back-side surface 101B of the semiconductor substrate 101. Each of the photoelectric conversion elements 103 is disposed in one individual pixel P of the solid-state imaging device 100.

In some embodiments, the solid-state imaging device 100 is a back-side illumination (BSI) image sensor, for example a BSI CMOS image sensor (BSI-typed CIS). In BSI image sensors, an interconnection layer 120 is formed on a front-side surface 101F of the semiconductor substrate 101 and disposed below the semiconductor substrate 101 as shown in FIG. 3. The interconnection layer 120 includes several metal layers 121 and several vias 122 disposed in several dielectric layers 123. The metal layers 121 are electrically connected with each other through the vias 122.

In BSI image sensors, a bond pad 105 is formed on the back-side surface 101B of the semiconductor substrate 101 and is electrically coupled to the interconnection layer 120 through a via 124 formed in the semiconductor substrate 101. Incident light illuminated on the BSI image sensors reaches the photoelectric conversion elements 103 without passing through the interconnection layer 120.

In some other embodiments, the solid-state imaging device 100 is a front-side illumination (FSI) image sensor, for example a FSI CMOS image sensor (FSI-typed CIS). In FSI image sensors, the interconnection layer 120 is reversed to be disposed above the semiconductor substrate 101. The interconnection layer 120 is also disposed between the bond pad 105 and the semiconductor substrate 101. In some embodiments, the bond pad 105 is in direct contact with a via of the interconnection layer 120, forming an electrical connection. Incident light illuminated on the FSI image sensors passes through the interconnection layer 120 and then reaches the photoelectric conversion elements 103.

Referring to FIG. 3 again, in some embodiments, a dielectric layer 107 is formed on the semiconductor substrate 101 and covers the bond pad 105. The dielectric layer 107 may be made of the same material of the dielectric layers 123 of the interconnection layer 120. In some embodiments, a light-shielding layer 109 is formed above the semiconductor substrate 101 and on the dielectric layer 107. The light-shielding layer 109 may be made of metal and includes a metal grid that consists of a plurality of partitions 109P. The metal grid of the light-shielding layer 109 has multiple squares, and each square of the metal grid corresponds to one individual pixel P of the solid-state imaging device 100. Moreover, the light-shielding layer 109 includes an extended portion 109E extending from the metal grid to the boundary between the peripheral region 100B and the pad region 100C. In other words, the edge of the light-shielding layer 109 is aligned with the boundary between the peripheral region 100B and the pad region 100C.

Next, in some embodiments, a planarization layer 111 is formed on the light-shielding layer 109 and to fill the square gaps of the metal grid. The planarization layer 111 is also disposed on the dielectric layer 107 and covers the bond pad 105 in the pad region 100C. The planarization layer 111 provides a flat top surface for subsequent processes.

Referring to FIG. 3 again, in some embodiments, a color filter layer 113 is formed on the planarization layer 111. The color filter layer 113 includes a plurality of color filter components, such as color filter components 113R, 113G and 113B which are colored red, green and blue, respectively. In other embodiments, the color filter components have other colors and the colors may be arranged by other arrangements. In the sensing region 100A, each color filter component 113R, 113G or 113B individually corresponds to one photoelectric conversion element 103 in each pixel P of the solid-state imaging device 100. Moreover, the color filter layer 113 includes an extended portion 113E disposed in the peripheral region 100B and the pad region 100C. The extended portion 113E covers the extended portion 109E of the light-shielding layer 109 and the bond pad 105. The extended portion 113E of the color filter layer 113 is made of the material of the color filter component 113R, 113G or 113B.

In some other embodiments, the light-shielding layer 109 is formed on the same level of the color filter layer 113. The partitions 109P of the light-shielding layer 109 are disposed between the color filter components 113R, 113G and 113B. In the embodiments, the planarization layer 111 can be omitted.

Next, in some embodiments, the microlens layer 115 is formed on the color filter layer 113. The microlens layer 115 includes the microlens array 115A disposed in the sensing region 100A, the second dummy structure 115B disposed in the peripheral region 100B, and the first dummy structure 115C disposed in the pad region 100C. The first dummy structure 115C includes a plurality of first microlens elements 115-1 arranged by a first pitch P1. The second dummy structure 115B includes a plurality of second microlens elements 115-2 arranged by a second pitch P2. The microlens array 115A includes a plurality of third microlens elements 115-3 arranged by a third pitch P3. In some embodiments, the first pitch P1, the second pitch P2 and the third pitch P3 are equal. Moreover, each of the third microlens elements 115-3 is disposed in one individual pixel P of the solid-state imaging device 100 and corresponds to one respective photoelectric conversion element 103.

In the embodiment of FIG. 3, the first microlens elements 115-1 of the first dummy structure 115C not only surround the area of the bond pad 105, but they are also disposed directly above the bond pad 105. In addition, the first microlens elements 115-1 are disposed at the edge of the solid-state imaging device 100. Moreover, in some embodiments, the top of the first dummy structure 115C is lower than the top of the second dummy structure 115B. The top of the second dummy structure 115B is lower than the top of the microlens array 115A.

Next, a passivation film 117 is conformally formed on the top surface of the microlens layer 115. In some embodiments, the passivation film 117 is a chemical vapor deposition (CVD) film. The material of the CVD passivation film 117 includes silicon oxide, silicon nitride, silicon oxynitride, or a combination thereof. The passivation film 117 continuously covers the first, second and third microlens elements 115-1, 115-2 and 115-3 that are disposed in the pad region 100C, the peripheral region 100B and the sensing region 100A, respectively. Based on the first and second dummy structures 115C and 115B of the microlens layer 115, it can prevent the passivation film 117 from cracking, delaminating, or experiencing related failures since the mismatch between the passivation film 117 and the microlens underlying layer such as the color filter layer 113 or the planarization layer 111 is not present in the peripheral region 100B and the pad region 100C of the solid-state imaging device 100.

Figure 4:
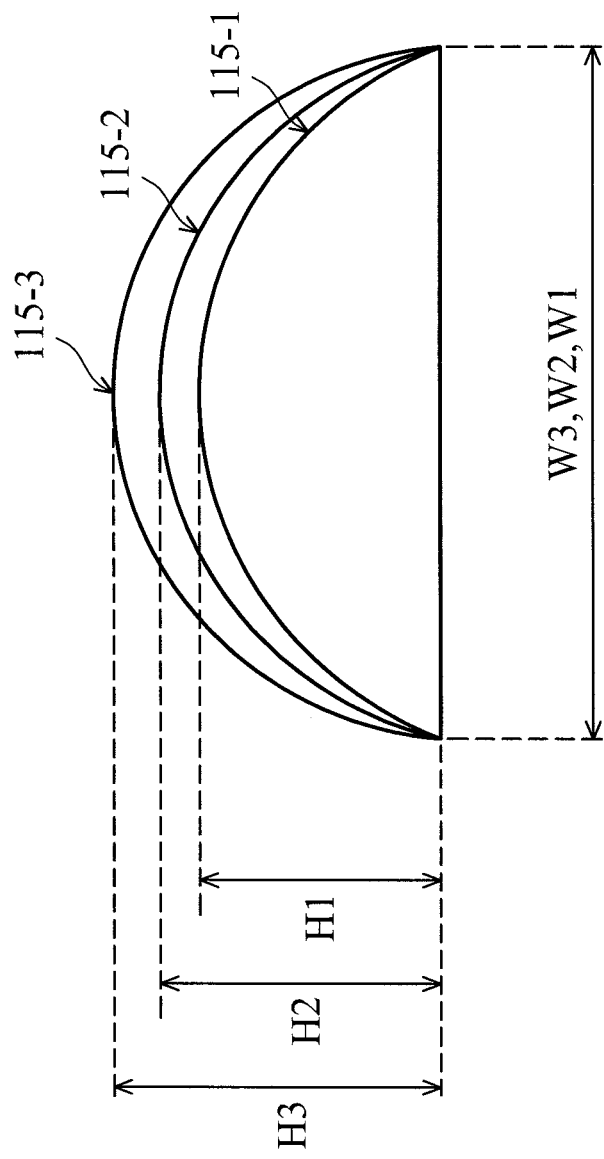
FIG. 4 shows relationships between various schematic cross sections of a convex lens body of a third microlens element of a microlens array, a convex lens body of a second microlens element of a second dummy structure, and a convex lens body of a first microlens element of a first dummy structure in a solid-state imaging device according to some embodiments.

FIG. 4 shows relationships between various cross sections of a convex lens body of the third microlens element 115-3 of the microlens array 115A, a convex lens body of the second microlens element 115-2 of the second dummy structure 115B, and a convex lens body of the first microlens element 115-1 of the first dummy structure 115C according to some embodiments. As shown in FIG. 4, the third microlens element 115-3 has a third microlens height H3 and a third bottom width W3. In some embodiments, the third bottom width W3 is equal to the pitch P3 (shown in FIG. 3) while the third microlens elements 115-3 are closely arranged. In addition, the third microlens element 115-3 has a third radius of curvature (referred to as ROC-3, not shown) that is equal to the radius of a third circle (referred to as C3, not shown) that has an arc from the outline of the convex lens body of the third microlens element 115-3.

Referring to FIG. 4 again, the second microlens element 115-2 has a second microlens height H2 and a second bottom width W2. In some embodiments, the second bottom width W2 is equal to the pitch P2 (shown in FIG. 3) while the second microlens elements 115-2 are closely arranged. In addition, the second microlens element 115-2 has a second radius of curvature (referred to as ROC-2, not shown) that is equal to the radius of a second circle (referred to as C2, not shown) that has an arc from the outline of the convex lens body of the second microlens element 115-2.

Referring to FIG. 4 again, the first microlens element 115-1 has a first microlens height H1 and a first bottom width W1. In some embodiments, the first bottom width W1 is equal to the pitch P1 (shown in FIG. 3) while the first microlens elements 115-1 are closely arranged. In addition, the first microlens element 115-1 has a first radius of curvature (referred to as ROC-1, not shown) that is equal to the radius of a first circle (referred to as C1, not shown) that has an arc from the outline of the convex lens body of the first microlens element 115-1.

According to the embodiments, the third radius of curvature (ROC-3) of the third microlens element 115-3 of the microlens array 115A is smaller than the second radius of curvature (ROC-2) of the second microlens element 115-2 of the second dummy structure 115B. In addition, the second radius of curvature (ROC-2) is smaller than the first radius of curvature (ROC-1) of the first microlens element 115-1 of the first dummy structure 115C. Moreover, the third microlens height H3 of the third microlens element 115-3 of the microlens array 115 is higher than the second microlens height H2 of the second microlens element 115-2 of the second dummy structure 115B. In addition, the second microlens height H2 is higher than the first microlens height H1 of the first microlens element 115-1 of the first dummy structure 115C. Moreover, the first bottom width W1 of the first microlens element 115-1, the second bottom width W2 of the second microlens element 115-2, and the third bottom width W3 of the third microlens element 115-3 have the same size.

Based on the above-mentioned relationships between the third, second, and first microlens elements of the microlens array 115A, the second dummy structure 115B and the first dummy structure 115C, respectively, in the microlens heights and the radii of curvature, the second dummy structure 115B and the first dummy structure 115C can prevent the passivation film 117 from cracking, delaminating, or experiencing related failures. Moreover, compared to solid-state imaging devices that do not have dummy structures in the pad region or the peripheral region, the solid-state imaging devices 100 of the embodiments can effectively avoid cracks, delamination, and related failures of the passivation film 117 in the peripheral region 100B and the pad region 100C, specifically around the area of the bond pad 105. As a result, the reliability and functionality of the solid-state imaging devices of the embodiments are enhanced.

In some embodiments, the various microlens elements of the microlens array 115A, the second dummy structure 115B and the first dummy structure 115C are formed by coating a lens material layer on the color filter layer 113. The lens material layer may be a photosensitive and transparent organic polymer material or a transparent inorganic material. Then, the lens material layer is patterned to form a plurality of segments with different dimensions in the sensing region 100A, the peripheral region 100B and the pad region 100C as viewed from the top. The lens material layer made of photosensitive and transparent organic polymer materials can be patterned by exposure and development processes. The lens material layer made of transparent inorganic materials can be patterned by etching with a hard mask disposed on the lens material layer as an etching mask.

In some embodiments, the dimension of the segments of the lens material layer in the sensing region 100A as viewed from the top is smaller than that in the peripheral region 100B before baking. In addition, the dimension of the segments of the lens material layer in the peripheral region 100B as viewed from the top is smaller than that in the pad region 100C before baking. Next, the segments of the lens material layer are reflowed by baking to form the first, second and third microlens elements 115-1, 115-2 and 115-3 of the first dummy structure 115C, the second dummy structure 115B and the microlens array 115A, respectively.

Figure 5:
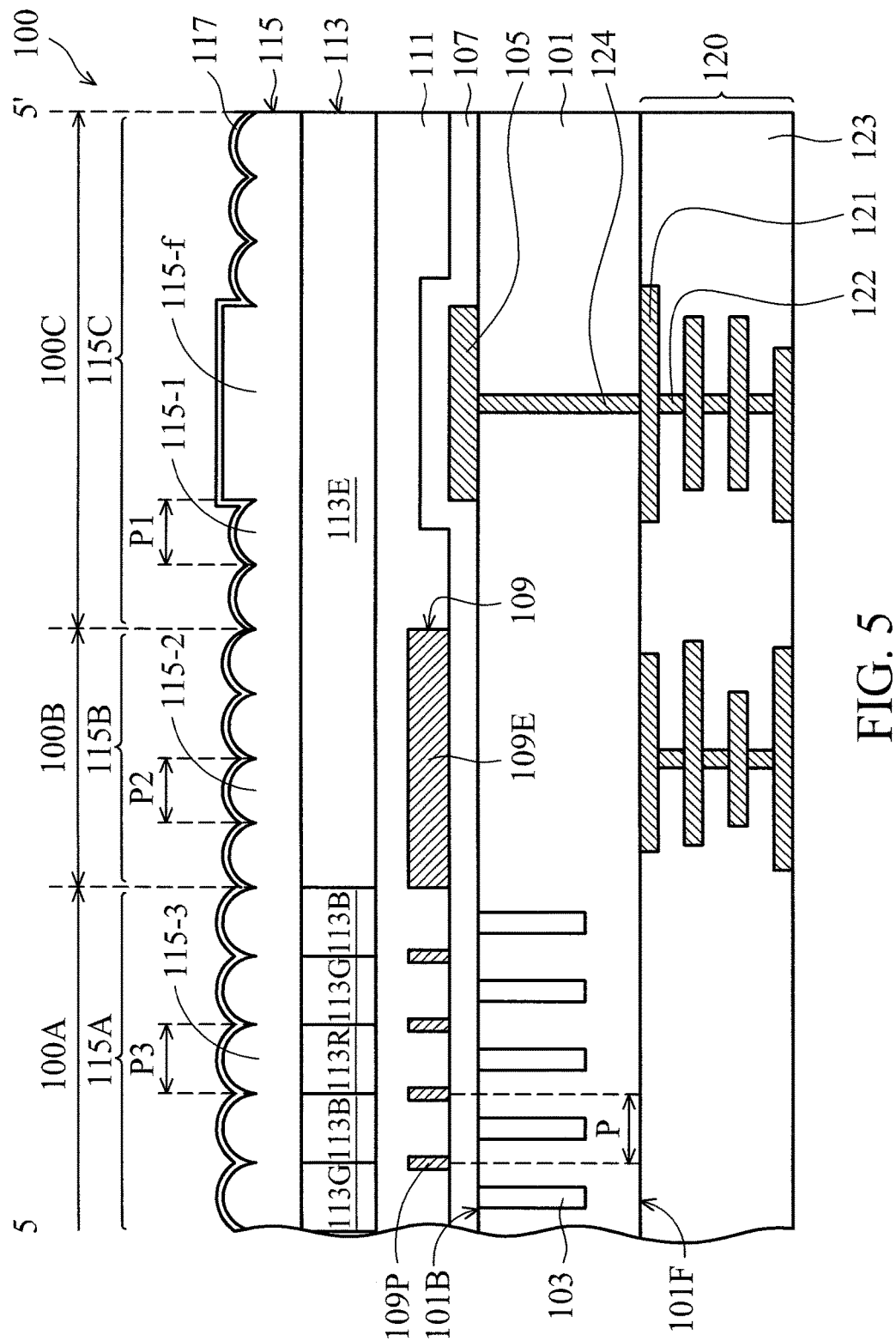
FIG. 5 shows a schematic partial cross section of a solid-state imaging device along line 5-5' of FIG. 1 according to some embodiments.

Referring to FIG. 5, a schematic partial cross section of a solid-state imaging device 100 along line 5-5' of FIG. 1 according to some embodiments is shown. The difference between the solid-state imaging devices 100 of FIG. 5 and FIG. 3 is that the first dummy structure 115C of the solid-state imaging device 100 in FIG. 5 has a flat portion 115-*f* to replace a portion of the first microlens elements 115-1 of the solid-state imaging device 100 in FIG. 3. As shown in FIG. 5, the flat portion 115-*f* of the first dummy structure 115C is disposed directly above the bond pad 105. In the embodiment of FIG. 5, the first dummy structure 115C also has the first microlens elements 115-1 disposed to surround the area of the bond pad 105. Moreover, except for the flat portion 115-*f*, the other elements of the solid-state imaging device 100 in FIG. 5 are the same as those in FIG. 3. In the solid-state imaging device 100 of FIG. 5, the relationships between the various microlens elements of the microlens array 115A, the second dummy structure 115B and the first dummy structure 115C in the microlens heights and the radii of curvature are also the same as those in the solid-state imaging device 100 of FIG. 3.

In some embodiments, the top of the flat portion 115-*f* is level with the top of the first microlens elements 115-1. In some other embodiments, the top of the flat portion 115-*f* is slightly lower or higher than the top of the first microlens elements 115-1. In addition, the passivation film 117 is continuously and conformally formed on the top surfaces of the first microlens elements 115-1 and the flat portion 115-*f*.

As a result, the solid-state imaging device 100 of FIG. 5 can also effectively prevent cracks, delamination, and related failures of the passivation film 117 in the pad region 100C, specifically around the area of the bond pad 105. Therefore, the reliability and functionality of the solid-state imaging devices of the embodiments are enhanced.

Figure 6:
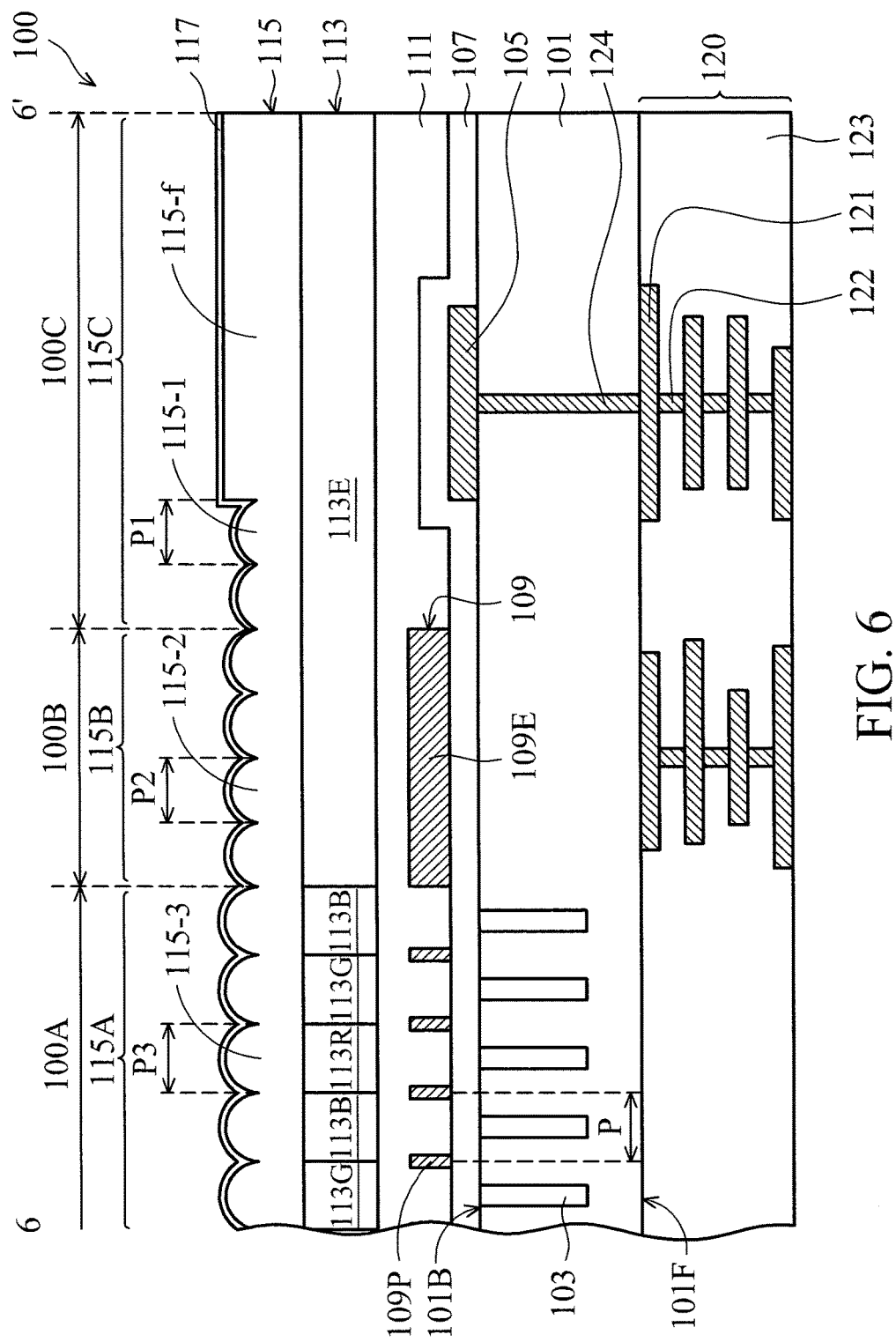
FIG. 6 shows a schematic partial cross section of a solid-state imaging device along line 6-6' of FIG. 1 according to some embodiments.

Referring to FIG. 6, a schematic partial cross section of a solid-state imaging device 100 along line 6-6' of FIG. 1 according to some embodiments is shown. The difference between the solid-state imaging devices 100 of FIG. 6 and FIG. 5 is that the flat portion 115-*f* of the first dummy structure 115C in FIG. 6 is not only disposed directly above the bond pad 105, but also it extends to an area outside of the area of the bond pad 105 up to the edge of the semiconductor substrate 101. As shown in FIG. 1 and FIG. 6, in the embodiments, the first dummy structure 115C also has the first microlens elements 115-1 disposed to surround the area of the bond pad 105 except for the side of the flat portion 115-*f* aligned with the edge of the semiconductor substrate 101. In the solid-state imaging device 100 of FIG. 6, except for the flat portion 115-*f*, the other elements are the same as those in FIG. 3. Moreover, in the solid-state imaging device 100 of FIG. 6, the relationships between the various microlens elements of the microlens array 115A, the second dummy structure 115B and the first dummy structure 115C in the microlens heights and the radii of curvature are also the same as those in FIG. 3. The flat portion 115-*f* of the solid-state imaging device 100 of FIG. 6 can be made of the same material and by the same processes as those in the embodiments of FIG. 5.

In some embodiments, the top of the flat portion 115-*f* in the solid-state imaging device 100 of FIG. 6 is level with the top of the first microlens elements 115-1. In some other embodiments, the top of the flat portion 115-f in the solid-state imaging device 100 of FIG. 6 may be slightly lower or slightly higher than the top of the first microlens elements 115-1. In addition, the passivation film 117 is continuously and conformally formed on the top surfaces of the first microlens elements 115-1 and the flat portion 115-f.

As a result, the solid-state imaging device 100 of FIG. 6 can also effectively avoid cracking, delaminating, and experiencing similar failures of the passivation film 117 in the pad region 100C, specifically around the area of the bond pad 105. Therefore, the reliability and functionality of the solid-state imaging devices of the embodiments are enhanced.

Figure 7:
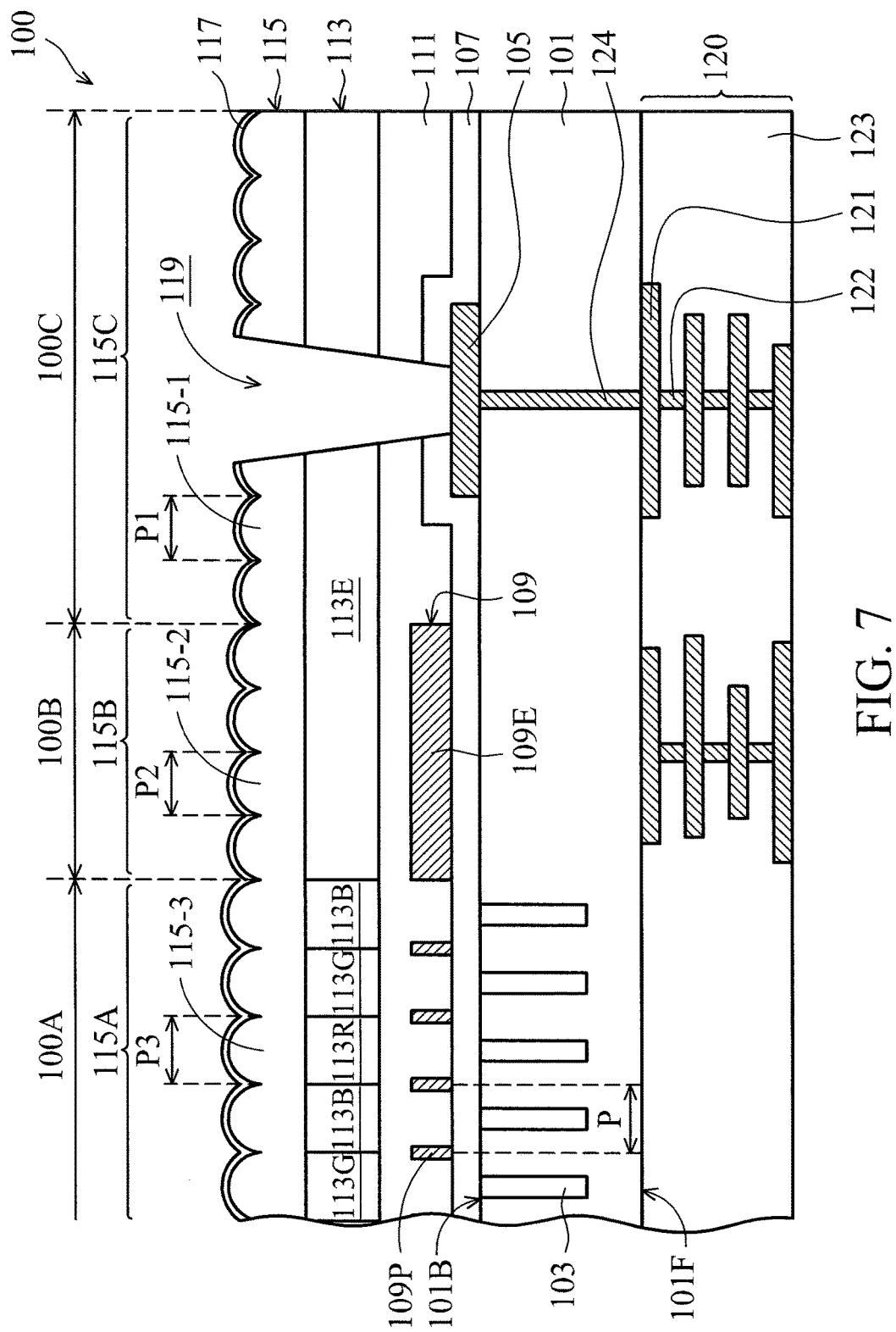
FIG. 7 shows a schematic partial cross section of a solid-state imaging device after an opening is formed to expose the bond pad in the solid-state imaging device of FIG. 3 according to some embodiments.

Referring to FIG. 7, according to some embodiments, a schematic partial cross section is shown of a solid-state imaging device 100 after an opening 119 is formed to expose the bond pad 105 in the solid-state imaging device 100 of FIG. 3. In addition, in some other embodiments, an opening similar to the opening 119 can also be formed in the solid-state imaging devices 100 of FIGS. 5 and 6 to expose the bond pad 105. The portion of the microlens layer 115 surrounding the opening that is formed to expose the bond pad 105 in the solid-state imaging devices 100 of FIGS. 5 and 6 has a cross section different from the cross section of the microlens layer 115 in the solid-state imaging device 100 of FIG. 7. According to the embodiments, after the passivation film 117 is formed on the microlens array 115A, the second dummy structure 115B and the first dummy structure 115C of the microlens layer 115, the opening 119 is formed by etching portions of the passivation film 117, the microlens layer 115, the color filter layer 113, the planarization layer 111 and the dielectric layer 107 to expose the bond pad 105. In other words, there is no opening to expose the bond pad 105 during the fabrication of the solid-state imaging devices 100 for forming the above-mentioned multiple layers above the bond pad 105. Because there is no opening to expose the bond pad 105, it provides a smooth topography for fabricating the above-mentioned multiple layers of the solid-state imaging devices 100 on the semiconductor substrate 101. Therefore, the embodiments of the solid-state imaging devices 100 can effectively prevent the passivation film 117 from cracking, delaminating, and experiencing related failures, specifically in the pad region 100C.

According to the embodiments, the microlens layer of the solid-state imaging devices includes the first and second dummy structures disposed in the pad region and the peripheral region, respectively. The first and second dummy structures integrated with the microlens array to form the microlens layer can prevent the passivation film deposited thereon from cracking, delaminating, and experiencing related failures, specifically in the pad region. Therefore, the reliability and functionality of the solid-state imaging devices of the embodiments are enhanced.

Furthermore, according to the embodiments, there is no opening to expose the bond pad during the fabrication of the solid-state imaging devices for forming the above-mentioned multiple layers above the bond pad. Thus, it can provide a smooth topography for fabricating the multiple layers of the solid-state imaging devices on the semiconductor substrate. Therefore, the fabrication quality of the embodiments of the solid-state imaging devices is also enhanced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state imaging device, having a sensing region, a pad region and a peripheral region located between the sensing region and the pad region, comprising:
   a semiconductor substrate;
   a plurality of photoelectric conversion elements disposed in the semiconductor substrate and in the sensing region;
   a bond pad disposed on the semiconductor substrate and in the pad region;
   a microlens layer, including a microlens array and a first dummy structure, disposed above the semiconductor substrate, wherein the microlens array is disposed in the sensing region, the first dummy structure is disposed in the pad region, and the first dummy structure includes a plurality of first microlens elements disposed to surround an area of the bond pad; and
   a passivation film conformally formed on a top surface of the microlens layer.

2. The solid-state imaging device as claimed in claim 1, wherein the first microlens elements are further disposed directly above the bond pad.

3. The solid-state imaging device as claimed in claim 1, wherein the first dummy structure further includes a flat portion disposed directly above the bond pad, and the passivation film is conformally formed on the flat portion.

4. The solid-state imaging device as claimed in claim 1, wherein the microlens layer further includes a second dummy structure disposed in the peripheral region, the second dummy structure includes a plurality of second microlens elements, and the microlens array includes a plurality of third microlens elements.

5. The solid-state imaging device as claimed in claim 4, wherein each of the third microlens elements of the microlens array has a third microlens height that is greater than a second microlens height of each of the second microlens elements of the second dummy structure.

6. The solid-state imaging device as claimed in claim 5, wherein the second microlens height is greater than a first microlens height of each of the first microlens elements of the first dummy structure.

7. The solid-state imaging device as claimed in claim 4, wherein each of the first microlens elements has a first radius of curvature, each of the second microlens elements has a second radius of curvature, and the first radius of curvature is greater than the second radius of curvature.

8. The solid-state imaging device as claimed in claim 7, wherein each of the third microlens elements of the microlens array has a third radius of curvature, and the second radius of curvature is greater than the third radius of curvature.

9. The solid-state imaging device as claimed in claim 4, wherein the top of the microlens array is higher than the top of the second dummy structure, and the top of the second dummy structure is higher than the top of the first dummy structure.

10. The solid-state imaging device as claimed in claim 4, wherein the third microlens elements of the microlens array, the second microlens elements of the second dummy structure and the first microlens elements of the first dummy structure are all arranged by the same pitch.

11. The solid-state imaging device as claimed in claim 1, wherein the first microlens elements of the first dummy structure are continuously and regularly arranged in the pad region.

12. The solid-state imaging device as claimed in claim 1, wherein the first microlens elements of the first dummy structure are discontinuously and randomly arranged in the pad region.

13. The solid-state imaging device as claimed in claim 4, wherein the second microlens elements of the second dummy structure are continuously and regularly arranged in the peripheral region.

14. The solid-state imaging device as claimed in claim 4, wherein the second microlens elements of the second dummy structure are discontinuously and randomly arranged in the peripheral region.

15. The solid-state imaging device as claimed in claim 1, wherein the passivation film is a chemical vapor deposited film, the material of the chemical vapor deposited film includes silicon oxide, silicon nitride, silicon oxynitride or a combination thereof, and the passivation film continuously covers the sensing region, the peripheral region and the pad region.

16. The solid-state imaging device as claimed in claim 1, further comprising:
a color filter layer disposed between the semiconductor substrate and the microlens layer;
a dielectric layer disposed between the color filter layer and the semiconductor substrate; and
an opening that penetrates through the passivation film, the microlens layer, the color filter layer and the dielectric layer to expose the bond pad.

17. The solid-state imaging device as claimed in claim 16, further comprising a light-shielding layer disposed on the semiconductor substrate and in the sensing region and the peripheral region, wherein the light-shielding layer has an edge aligned with a boundary between the peripheral region and the pad region, the light-shielding layer comprises a metal grid, and each square of the metal grid corresponds to one individual pixel of the solid-state imaging device.

18. The solid-state imaging device as claimed in claim 17, further comprising a planarization layer disposed between the light-shielding layer and the color filter layer, and the opening penetrates further through the planarization layer.

19. The solid-state imaging device as claimed in claim 1, wherein the first dummy structure further includes a flat portion disposed directly above the bond pad and extending to an area outside of the area of the bond pad until an edge of the semiconductor substrate, and the passivation film is conformally formed on the flat portion.

20. The solid-state imaging device as claimed in claim 1, further comprising an interconnection layer disposed below the semiconductor substrate, or disposed between the semiconductor substrate and the bond pad, wherein the bond pad is electrically connected to the interconnection layer.

* * * * *